(12) United States Patent
Nakase

(10) Patent No.: US 6,765,413 B2
(45) Date of Patent: Jul. 20, 2004

(54) BUS CIRCUIT PREVENTING DELAY OF THE OPERATIONAL SPEED AND DESIGN METHOD THEREOF

(75) Inventor: Yasunobu Nakase, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/118,145

(22) Filed: Apr. 9, 2002

(65) Prior Publication Data

US 2002/0190761 A1 Dec. 19, 2002

(30) Foreign Application Priority Data

Jun. 18, 2001 (JP) ........................................ 2001-183116

(51) Int. Cl.$^7$ ........................................... H03K 19/175
(52) U.S. Cl. .......................... 326/86; 326/30; 326/90; 716/6; 710/100; 710/126
(58) Field of Search .............................. 326/30, 27, 83, 326/86, 90; 716/6, 10, 12; 710/100, 126

(56) References Cited

U.S. PATENT DOCUMENTS

| | | | | |
|---|---|---|---|---|
| 5,202,593 A | * | 4/1993 | Huang et al. ................. | 326/86 |
| 5,306,967 A | * | 4/1994 | Dow ........................... | 326/101 |
| 5,736,870 A | * | 4/1998 | Greason et al. ............... | 326/86 |
| 5,994,946 A | * | 11/1999 | Zhang ......................... | 327/403 |
| 6,389,581 B1 | * | 5/2002 | Muddu et al. .................. | 716/6 |
| 6,414,542 B2 | * | 7/2002 | Lin et al. ..................... | 327/565 |
| 6,448,810 B1 | * | 9/2002 | Nomura ....................... | 326/82 |

FOREIGN PATENT DOCUMENTS

JP        8-102491        4/1996

OTHER PUBLICATIONS

"Repeater Insertion Method and its Application to a 300MHz 128–bit 2–way Superscalar Microprocessor", Norman Kojima et al., IEEE 2000, 0–7803–5973–9/00, pp. 641–646.

* cited by examiner

Primary Examiner—Vibol Tan
(74) Attorney, Agent, or Firm—McDermott Will & Emery LLP (57) ABSTRACT

In a bus circuit which includes a plurality of signal lines, insertion pattern α, which provides repeaters in only an odd numbered series of signal lines, and insertion pattern β, of which the segment length is equal to that of pattern α and which provides repeaters to only an even numbered series of signal lines, are arranged in an alternating manner in accordance with the length of the signal lines. As a result, the segments during which data signals on the neighboring signal lines run together in opposite phases become half the entire length of the signal lines. Therefore, this bus circuit can prevent the operational speed from becoming slowed.

11 Claims, 9 Drawing Sheets

BUS CIRCUIT PREVENTING DELAY OF THE OPERATIONAL SPEED AND DESIGN METHOD THEREOF

BACKGROUND OF THE INVENTION

1. Field of the Invention

The present invention relates to a bus circuit, in particular, to a bus circuit which includes a plurality of signal lines.

2. Description of the Background Art

A semiconductor integrated circuit device is formed of a plurality of circuit blocks represented by an operation unit or a memory. Data exchange among circuit blocks within the semiconductor integrated circuit device is, in general, carried out by using a signal line.

Figure 11:
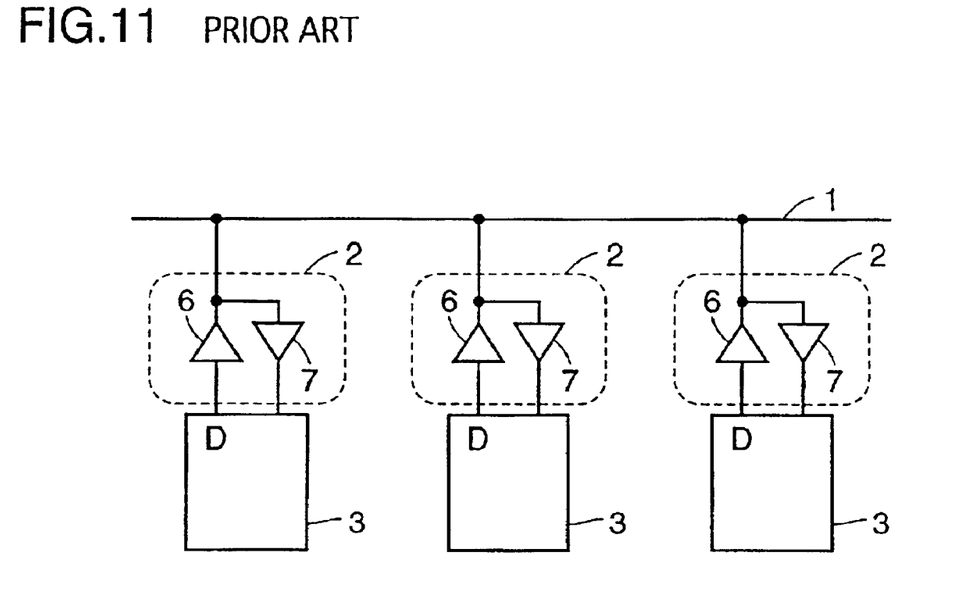
FIG. 11 is a block diagram of a conventional bus circuit within a semiconductor integrated circuit device.

FIG. 11 is a block diagram of a conventional bus circuit within a semiconductor integrated circuit device.

Referring to FIG. 11, a plurality of circuit blocks 3, respectively, have input/output circuits 2. Respective input/output circuits 2 are connected to a signal line 1. Input/output circuits 2 include drivers 6 and receivers 7. Drivers 6 output data from circuit blocks 3 to signal line 1. Receivers 7 receive data from signal line 1. Here, though three circuit blocks are shown in FIG. 1, a plurality of additional circuit blocks may be included.

In order to prevent a plurality of circuit blocks 3 from transmitting data at the same time, circuit blocks 3 cannot transmit data unless the usage right for signal line 1 is acquired. Arbitration of the usage right of the signal line 1 among the circuit blocks is carried out by a dedicated control circuit (not shown).

In FIG. 11, circuit blocks 3 which have, respectively, one input/output circuit 2 are connected to one signal line 1. 1 bit of data is transmitted on one signal line. Conventionally, a data processing unit of a circuit block 3 is not 1 bit but is 32 bits, or more. Accordingly, in practice there are 32, or more, signal lines 1 within the bus circuit and a circuit block 3 has a plurality of input/output circuits 2 connected to respective signal lines.

In recent years the process dimensions of a semiconductor integrated circuit device have become scaled and, as a result, the amount of data which can be processed by a circuit block 3 within the bus circuit at one time has increased from 32 bits to 64 bits or, further, to 128 bits, or more.

Figure 12:
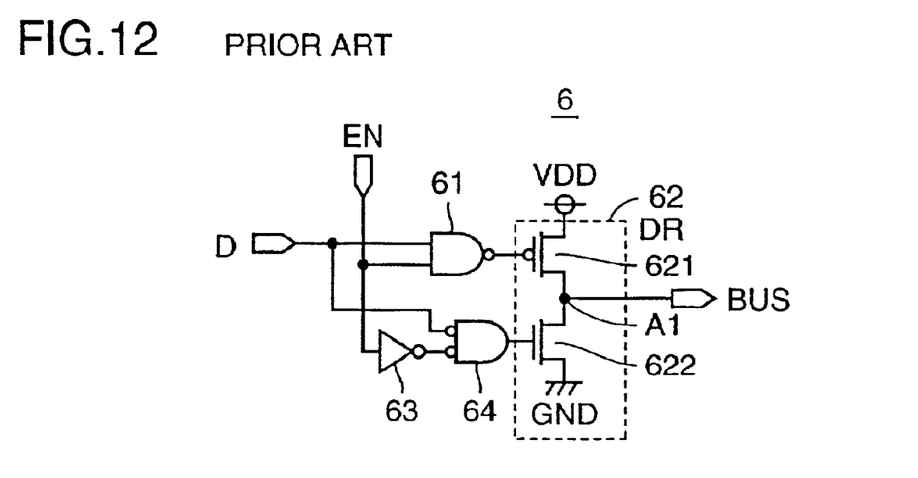
FIG. 12 is a circuit diagram of a driver in FIG. 11.

FIG. 12 is a circuit diagram of a driver 6 in FIG. 11.

Referring to FIG. 12, driver circuit 6 includes inverters 62, 63, a NAND gate 61 and a NOR gate 64. Inverter 62 includes a P channel MOS transistor 621 and an N channel MOS transistor 622. A driver signal EN is a signal which is inputted to NAND gate 61 and is inputted to NOR gate 64 via inverter 63 and is a signal which is inputted from the outside in order to activate driver 6.

In a circuit block 3 which has acquired the bus usage right, driver activation signal EN is set to an active condition (H level). Therefore, driver 6 outputs a signal of H level from driver 62 when data signal D is at H level and outputs a signal of L level when data signal D is at L level. In addition, in a circuit block 3 which has not acquired the bus usage right, driver activation signal EN is set at L level. Therefore, P channel MOS transistor 621 and N channel MOS transistor 622 in driver 6 are both turned off and, as a result, driver 6 is converted to a high impedance condition.

On the other hand, a receiver 7 receives the entirety of the data on signal line 1. The received data is transmitted to circuit block 3 and the circuit block determines whether or not the received data is utilized. Through the above operation, data exchange is carried out among circuit blocks 3 within the bus circuit.

Figure 13:
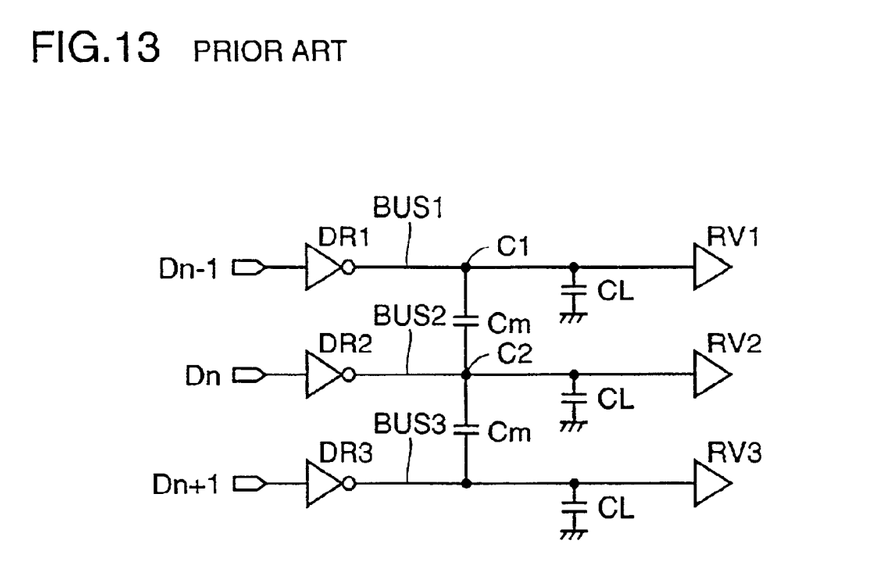
FIG. 13 is a circuit diagram showing three signal lines for transmitting data signals from among a plurality of signal lines within the bus circuit.

FIG. 13 is a circuit diagram showing 3 signal lines for transmitting data signals among a plurality of signal lines within the bus circuit.

Referring to FIG. 13, a signal line BUS2 is a signal line neighboring signal lines BUS1 and BUS3. Signal line BUS2 transfers a data signal D, signal lines BUS1 transfers a data signal $D_{n-1}$ and signal lines BUS3 transfers a data signal $D_{n+1}$, respectively. In addition, drivers DR1 to DR3 are, respectively, connected to one end of signal lines BUS1 to BUS3. Furthermore, receivers RV1 to RV3 are, respectively, connected to the other end of signal lines BUS1 to BUS3.

Here, the wire capacitance which is driven when driver DR2 outputs data signal $D_n$ to signal line BUS2 is described.

First, the case where data signals $D_{n+1}$ and $D_{n-1}$ change while in a phase opposite to that of data signal $D_n$ is described.

At this time, capacitance Cm between wires for data signal $D_n$ and data signal $D_{n+1}$ appears twice as large as it actually is due to the Miller effect because when the potential of capacitance Cm between wires at one terminal C1 changes from power source potential VDD to ground potential GND, the potential of capacitance Cm between wires at the other terminal C2 changes from ground potential GND to power source potential VDD. Therefore, the amount of relative potential change from terminal C1 to terminal C2 becomes 2VDD.

In the same manner, capacitance Cm between wires for data signal $D_n$ and $D_{n-1}$ appears twice as large as it actually is.

From the above, a wire capacitance Cn that must be driven in order for driver DR2 to output data signal $D_n$ onto signal line BUS2 is given in the following equation (1).

$$Cn=2Cm+2Cm+CL=4Cm+CL \quad (1)$$

wherein CL is a capacitance between the signal line and the ground.

Next, the case where data signals $D_{n+1}$ and $D_{n-1}$ change while in the same phase as that of data signal $D_n$ is described.

At this time, potential difference between terminals of capacitance Cm between wires does not occur. Accordingly, wire capacitance Cn that must be driven in order for driver DR2 to output data signal $D_n$ onto signal line BUS2 is given in the following equation (2).

$$Cn=CL \quad (2)$$

Next, the case where data signals $D_{n+1}$ and $D_{n-1}$ do not change and only data signal $D_n$ changes is described.

At this time, the Miller effect does not occur with capacitance Cm between wires. Accordingly, wire capacitance Cn that must be driven in order for driver DR2 to output data signal $D_n$ onto signal line BUS2 is given in the following equation (3).

$$Cn=Cm+Cm+CL=2Cm+CL \quad (3)$$

In the conventional bus circuit, since capacitance CL between the signal line and the ground is larger than capacitance Cm between wires, the transmission speed of a data signal is not affected by a change of a data signal on the neighboring signal line. However, in recent years, miniature processing technology for signal lines has progressed and, therefore, signal line pitches have become narrower. As a result, capacitance Cm between wires has become larger than capacitance CL between the signal line and the ground.

Here, a change of transmission speed of a data signal in the case that a data signal on a neighboring signal line has changed relative to data signal $D_n$ on signal line BUS2 in FIG. 13 is described.

The amount of time for data signal $D_n$ to change from power source potential VDD or ground potential GND to VDD/2 is defined as a data signal transmission time $\Delta t$. Data signal transmission time $\Delta t$ is approximated in the next equation (4).

$$\Delta t = VDD \times Cn/ID/2 \quad (4)$$

wherein ID is an average current driving force of the driver.

For example, it is assumed that capacitance Cm between wires/ground capacitance CL is 2. In the case that data signals $D_{n+1}$ and $D_{n-1}$ change while in a phase opposite to that of data signal $D_n$, a data signal transmission time $\Delta t1$ of data signal $D_n$ is given in the following equation from equations (1) and (4).

$$\Delta t1 = VDD \times (4Cm+CL)/2ID = 9VDD \times CL/2ID \quad (5)$$

In addition, in the case that data signals $D_{n+1}$ and $D_{n-1}$ change while in the same phase as that of data signal $D_n$, a data signal transmission time $\Delta t2$ of data signal $D_n$ is given in the following equation from equations (2) and (4).

$$\Delta t2 = VDD \times (CL)/2ID = VDD \times CL/2ID \quad (6)$$

From the above results, the maximum value of a data signal transmission time $\Delta t$ of data signal $D_n$ may be nine times larger than the minimum value thereof due to a change of the data signal on a signal line neighboring signal line BUS2.

The operational speed of a semiconductor integrated circuit device is determined by the slowest operation case.

As a result of the above, though scaled physical dimension of signal lines reduces the capacitance between the signal line and the ground, it increases the capacitance between wires and slows the operational speed.

A measure for solving this problem has been proposed in Japanese Patent Laying-Open No. 8-102491(1996).

Figure 14:
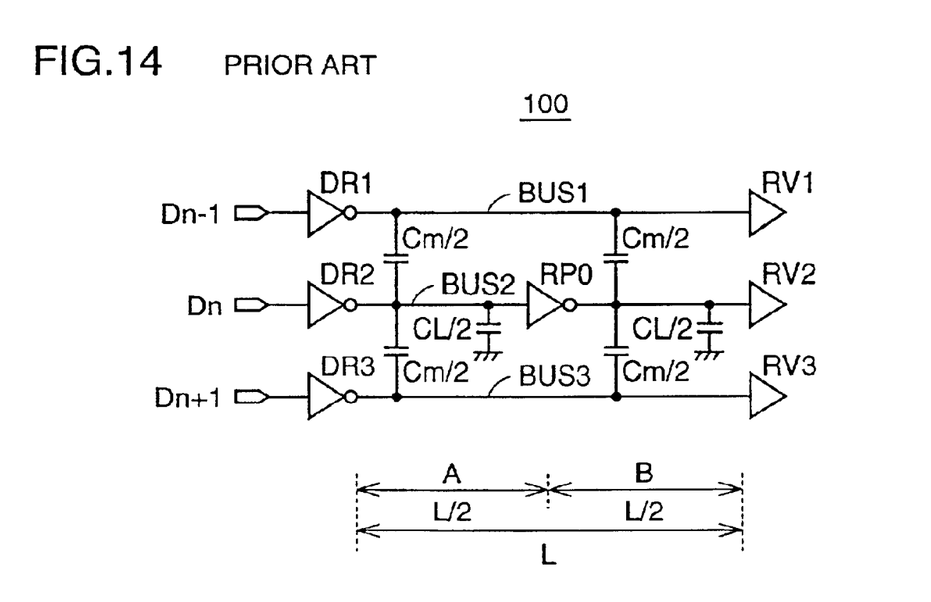
FIG. 14 is a circuit diagram showing three signal lines for transmitting data signals from among a plurality of signal lines within the bus circuit.

FIG. 14 is a circuit diagram showing three signal lines for transmitting data signals among a plurality of signal lines within a bus circuit.

Referring to FIG. 14, in this bus circuit 100, a repeater RP0 is inserted only into signal line BUS2 of signal lines BUS1 to BUS3 of which the signal line length is L. Repeater RP0 is inserted into a place halfway from the start of the signal line length L. The other parts of the circuit configuration are the same as in FIG. 13. Repeater RP0 inverts and outputs inputted data signal $D_n$.

In bus circuit 100, segments where data signals of neighboring signal lines BUS1 to BUS3 are in opposite phases occupy half of the signal line length. Accordingly, a slowing of operational speed of the bus circuit can be prevented.

As described above, in the bus circuit proposed in Japanese Patent Laying-Open No. 8-102491(1996), at least one repeater is inserted into only an odd numbered series of signal lines or into only an even numbered series of signal lines from among a plurality of signal lines. The inserted repeater reduces segments where data signals in opposite phases run at the same time in neighboring signal lines.

Therefore, the bus circuit can prevent a slowing of the operational speed.

However, since in the bus circuit proposed in Japanese Patent Laying-Open No. 8-102491(1996) a repeater is inserted into only an odd numbered series of signal lines or into only an even numbered series of signal lines from among a plurality of signal lines, only data signals in the signal lines into which repeaters are inserted are slowed. Accordingly, the timing of signal change shifts between a data signal of a signal line into which a repeater is inserted and a data signal of a signal line into which a repeater is not inserted.

By inserting amplifiers, of which the number is equal to the number of inserted repeaters, into a signal line into which no repeaters RP0 are inserted, the shift of the timing of the signal change can be eliminated. For example, by inserting one amplifier to, respectively, signal lines BUS1 and BUS3, the shift of the timing of the signal change of the data signal inputted from receiver RV1 to 3 is eliminated. However, the insertion of the amplifiers increases the power consumption of the bus circuit.

SUMMARY OF THE INVENTION

A purpose of this invention is to provide a bus circuit that can prevent a slowing of operational cycle time without a shift of the time of the signal change among the signal lines.

A bus circuit according to this invention includes a plurality of signal lines for transmittig data and repeaters for logically inverting data which are provided for respective signal lines wherein at least one repeater is provided for each signal line so that segments for transmitting data in the opposite phase is restricted to half of the signal line length in neighboring signal lines.

Thereby, capacitance between wires of signal lines is lowered. As a result, the operational speed of the bus circuit is prevented from being slowed.

Preferably, a plurality of signal lines include first segments wherein repeaters are provided only for an odd numbered series of signal lines and second segments, of which the segment length is equal to that of the first segments and wherein repeaters are provided only for an even numbered series of signal lines, and the first segments and the second segments are arranged in an alternating manner in accordance with the signal line length.

Thereby, the circuit design of a bus circuit becomes easy in accordance with the signal line length.

Preferably, the signal line transfers data in one direction.

Preferably, the signal line transfers data in two directions.

Preferably, the signal line is connected to a plurality of circuit blocks.

Preferably, the plurality of circuit blocks are operation units.

Preferably, the plurality of circuit blocks are memories.

A bus circuit design method according to this invention is a bus circuit design method for designing a bus circuit which includes a plurality of signal lines for transmitting data and includes the step of preparing first segments wherein repeaters for logically inverting data are provided only for an odd numbered series of signal lines and second segments, of which the segment length is equal to that of the first segments and wherein repeaters are provided only for an even numbered series of signal lines, the step of determining the numbers of the first segments and the second segments to be arranged in response to the set length of the signal line and the step of alternately placing the first segments and the second segments in accordance with the determined numbers of segments.

As described above according to the present invention, the operational speed of a bus circuit is not slowed by inserting repeaters into the signal lines so that the segments wherein data signals in the opposite phases that run together between neighboring signal lines become half of the signal line length. In addition, the slowing of the operational speed can be prevented by activating only the repeaters which correspond to the direction of the data signal flow even in bi-directional signal lines.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention are described in detail referring to the drawings. Here, the same symbols are attached to the same or corresponding parts in the drawings, of which the descriptions are not repeated.

[First Embodiment]

Figure 1:
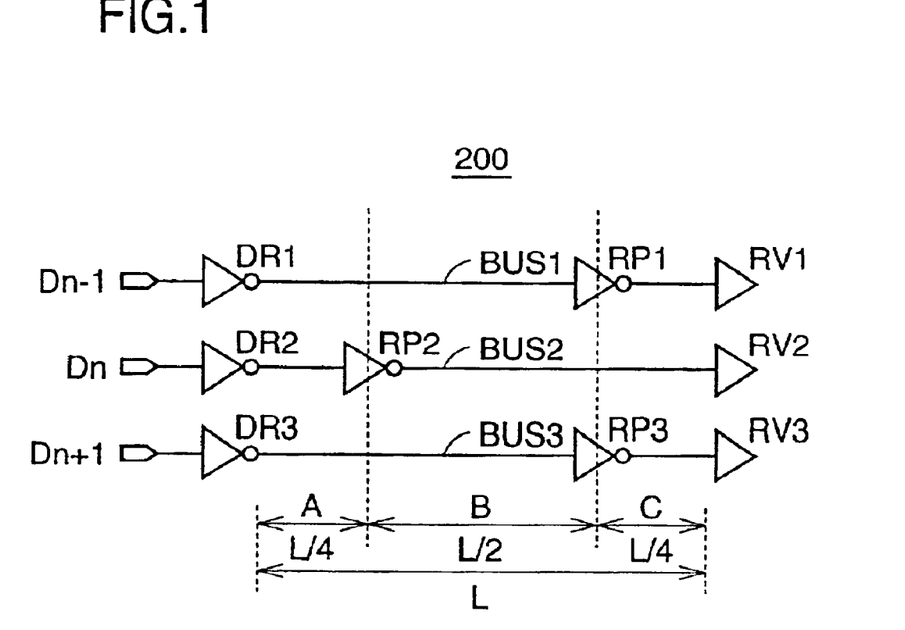
FIG. 1 is a circuit diagram of a bus circuit according to a first embodiment of this invention.

FIG. 1 is a circuit diagram of a bus circuit according to the first embodiment of this invention.

Referring to FIG. 1, a bus circuit 200 includes signal lines BUS1 to BUS3, drivers DR1 to DR3 and receivers RV1 to RV3.

Driver DR1 is connected to one end of signal line BUS1 while receiver RV1 is connected to the other end of signal line BUS1. In the same manner, driver DR2 and receiver RV2 are connected to signal line BUS2 while driver DR3 and receiver RV3 are connected to signal line BUS3, respectively. Signal line BUS2 transfers data signal $D_n$. In addition, signal line BUS1 transfers data signal $D_{n-1}$ and signal line BUS3 transfers data signal $D_{n+1}$, respectively.

Repeater RP1 is inserted into signal line BUS1. In the same manner, repeaters RP2, RP3 are, respectively, inserted into signal lines BUS2, BUS3.

Here, the insertion positions of repeaters RP1 to RP3 are described. The signal line length of signal lines BUS1 to BUS3 in FIG. 1 is assumed to be L. The distance between repeater RP2 provided in signal line BUS2 and driver DR2 is referred to as segment A. A distance gained by subtracting the distance of segment A from the distance between repeater RP1 and driver DR1 is referred to as segment B. The distance between repeater RP1 and receiver RV1 is referred to as segment C. The insertion position of repeater RP3 into signal line BUS3 is a position corresponding to the insertion position of repeater RP1 into signal line BUS1.

When repeaters RP1 to RP3 are inserted according to the position as shown above, repeaters RP1 to RP3 are inserted so that section B becomes half of the signal line length L. FIG. 1 shows the case of segment A segment C=L/4 and segment B=L/2.

The operation is described when data signal $D_n$ is outputted from driver DR2 in bus circuit 200 which has the above described circuit configuration.

First, the case wherein data signal $D_n$ and data signal $D_{n-1}$ run together on respective signal lines in opposite phases is described. Repeater RP2 is provided in signal line BUS2. Therefore, after passing through segment A, the signal logic of data signal $D_n$ is inverted. On the other hand, data signal $D_{n-1}$ is inverted in its signal logic by repeater RP1 during segment C. Accordingly, data signals $D_n$ and $D_{n-1}$ run together in the same phase during segment B. The relationships between data signals $D_n$ and $D_{n+1}$ are the same as the relationships between data signals $D_n$ and $D_{n-1}$, of which the descriptions are not repeated.

As a result of the above, bus circuit 200 halves the segment wherein data signals on the neighboring signal lines run together in opposite phases.

In the case that data signal $D_n$ and data signal $D_{n-1}$ are transferred on the respective signal lines in the same phase, data signal $D_n$ and data signal $D_{n-1}$ run together during segment B in opposite phases. As a result, bus circuit 200 halves the segment during which data signals on the neighboring signal lines are transferred in opposite phases. The relationships between data signals $D_n$ and $D_{n+1}$ are the same as the relationships between data signals $D_n$ and $D_{n+1}$ of which the descriptions are not repeated.

As described above, bus circuit 200 makes the segment during which data signals on the neighboring signal lines run together in opposite phases be half the signal line length. Therefore, the operation speed of bus circuit 200 is prevented from being slowed.

In addition, since repeaters are inserted into all of the signal lines, the timing of the signal change of the data signals does not become shifted.

In addition, repeaters are provided on all of the signal lines within bus circuit 200. Therefore, the polarities of data signal $D_{n-1}$ inputted into receiver RV1 and data signal $D_n$ inputted into receiver RV2 are not inverted in the neighboring signal lines BUS1, BUS2. Accordingly, it is not necessary to logically invert the data signal that is received by either of the receivers on the neighboring signal lines. Therefore, the design efficiency of the bus circuit is improved.

[Second Embodiment]

In the case that the signal line length of a bus circuit is very long, traveling speed of data signals becomes faster when a plurality of repeaters are provided on the signal lines. Furthermore, in order to prevent the slowing of the operation of the bus circuit, the segment during which the data signals on the neighboring signal lines run in opposite phases may be made half.

Here, a bus circuit design method in the case that a plurality of repeaters are provided in one signal line is described.

Figure 2A:
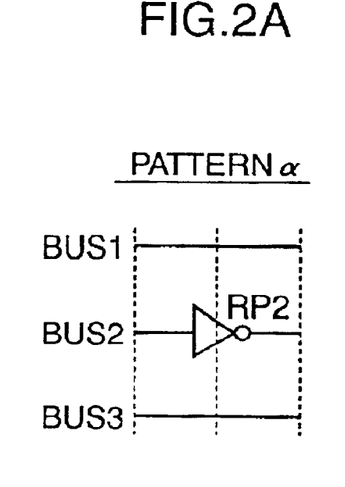
FIG. 2A is a diagram of a repeater insertion pattern in neighboring signal lines.
Figure 2B:
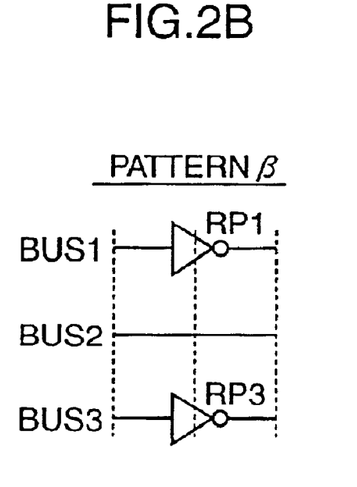
FIG. 2B is a diagram of another example of a repeater insertion pattern in neighboring signal lines.

FIGS. 2A and 2B are diagrams of repeater insertion patterns in neighboring signal lines.

Referring to FIGS. 2A and 2B, as for the repeater insertion patterns in signal lines BUS1 to BUS3, there are an insertion pattern α wherein repeater RP2 is inserted into signal line BUS2 while no repeaters are inserted into signal lines BUS1 and BUS3 and an insertion pattern β wherein repeater RP1 is inserted into signal line BUS1 and repeater RP3 is inserted into signal line BUS3, respectively, while no repeaters are inserted into signal line BUS2.

In the case that a bus circuit is designed, insertion pattern α shown in FIG. 2A and insertion pattern β shown in FIG. 2B are arranged in an alternating manner. The number of utilized insertion patterns is determined in accordance with the signal line length, the operation speed, the power consumption, and the like, of the designed bus circuit.

Figure 3:
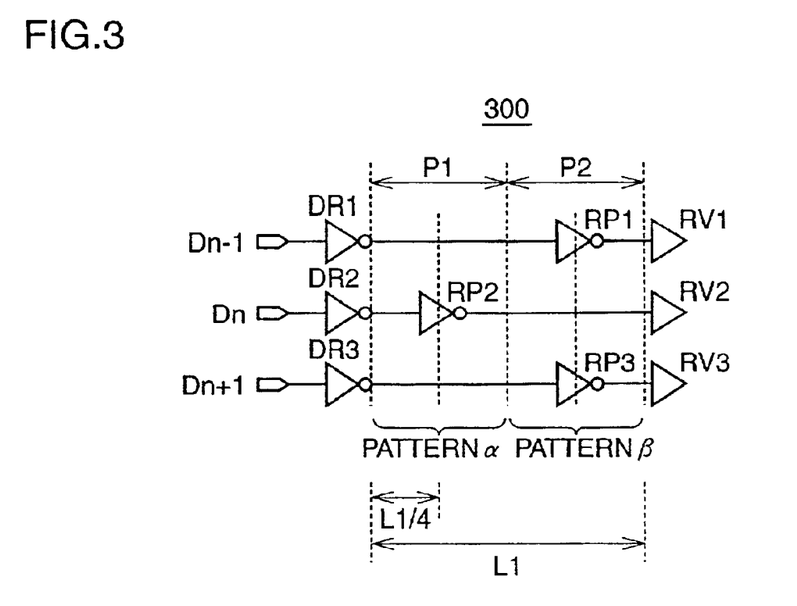
FIG. 3 is a circuit diagram of a bus circuit in the case that two insertion patterns are utilized as an example of a circuit diagram of a bus circuit according to a second embodiment of this invention.

FIG. 3 is a circuit diagram of a bus circuit of the case where two insertion patterns are utilized as a circuit diagram of an example of a bus circuit according to the second embodiment of this invention.

Referring to FIG. 3, a bus circuit 300 includes signal lines BUS1 to BUS3 of the signal line length L1, drivers DR1 to DR3 and receivers RV1 to RV3. Driver DR1 is connected to one end of signal line BUS1 while receiver RV1 is connected to the other end of signal line BUS1. In the same manner, driver DR2 and receiver RV2 are connected to signal line BUS2. Driver DR3 and receiver RV3 are connected to signal line BUS3.

Here, in the case where it is determined that the optimal number of insertion patterns utilized by the bus circuit of the signal line length L1 is two, insertion pattern α of FIG. 2A is provided in segment P1 gained by halving the signal line length L1 while insertion pattern β of FIG. 2B is provided in segment P2. When insertion pattern α is provided in segment P1, repeater RP2 is inserted into the central position of signal line BUS2 in segment P1. In the same manner, when insertion pattern β is provided, repeater RP1 is provided in the central position of signal line BUS1 in segment P2 while repeater RP3 is provided in the central position of signal line BUS3 in segment P2.

In the above described circuit configuration, bus circuit 300 halves the segment during which data signals on the neighboring signal lines run together in opposite phases.

Figure 4:
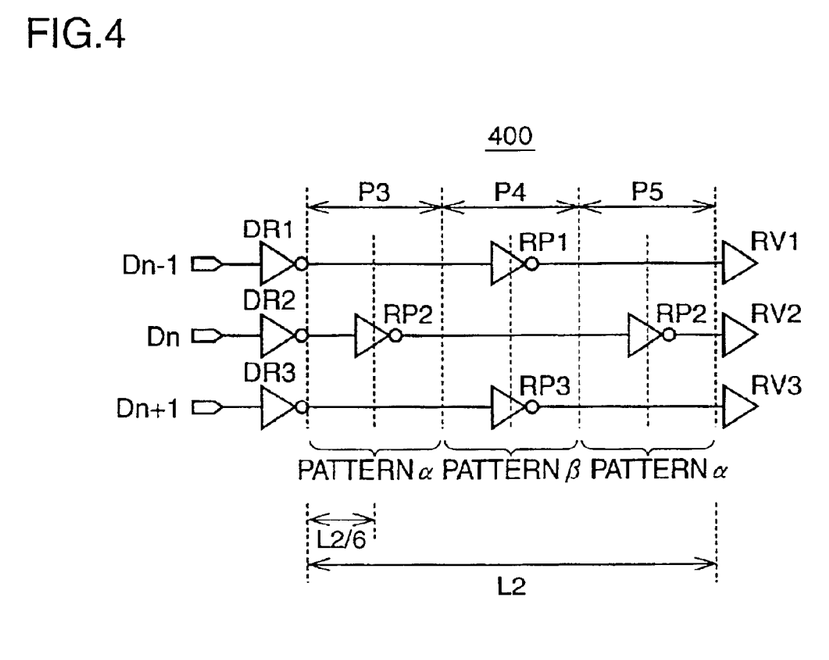
FIG. 4 is a circuit diagram of a bus circuit in the case that three insertion patterns are utilized.

FIG. 4 is a circuit diagram of a bus circuit in the case wherein three insertion patterns are utilized.

Referring to FIG. 4, a bus circuit 400 includes signal lines BUS1 to BUS3 of signal line length L2, drivers DR1 to DR3 and receivers RV1 to RV3. The connection relationships among respective signal lines, drivers and receivers are the same as that of bus circuit 300 in FIG. 3, of which the descriptions are not repeated.

Here, in the case where it is determined that the optimal number of insertion patterns provided by a bus circuit of signal line length L2 is three, insertion pattern α is provided in segments P3 and P5 from among segments P3 to P5 which are obtained by dividing signal line length L2 into three equal lengths. In addition, insertion pattern β is provided in segment P4. Here, insertion pattern β may be provided in segments P3 and P5 while insertion pattern α may be provided in segment P4.

In the above described circuit configuration, bus circuit 400, which utilizes three insertion patterns in the bus circuit, halves the segment during which data signals on the neighboring signal lines run together in opposite phases in the same manner as bus circuit 300.

Figure 5:
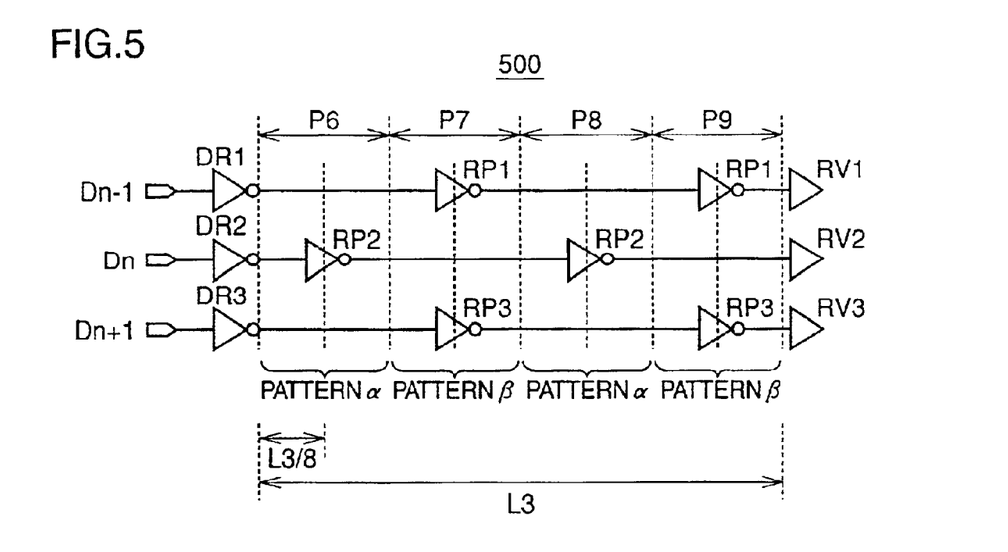
FIG. 5 is a circuit diagram of a bus circuit in the case that four insertion patterns are utilized.

FIG. 5 is a circuit diagram of a bus circuit in the case that four insertion patterns are utilized.

Referring to FIG. 5, a bus circuit 500 includes signal lines BUS1 to BUS3 of signal line length L3, drivers DR1 to DR3 and receivers RV1 to RV3. The connection relationships among respective signal lines, drivers and receivers are the same as that of bus circuit 300 in FIG. 3, of which the descriptions are not repeated.

Here, in the case where it is determined that the optimal number of insertion patterns provided by a bus circuit 500 of signal line length L3 is four, insertion pattern α is provided in segments P6 and P8 from among segments P6 to P9 which are obtained by dividing signal line length L3 into four equal lengths. In addition, insertion pattern β is provided in segments P7 and P9.

Here, insertion pattern β may be provided in segments P6 and P8 while insertion pattern α may be provided in segments P7 and P9.

In the above described circuit configuration, bus circuit 500, wherein four insertion patterns are utilized, halves the segment during which data signals on the neighboring signal lines run together in opposite phases.

As described above, two types of insertion patterns shown in FIGS. 2A and 2B are provided alternately in the bus circuit. As a result, the segment during which data signals on the neighboring signal lines run together in opposite phases becomes half the signal line length. Thereby, the slowing of the operation speed of the bus circuit is prevented.

In addition, in the bus circuit according to the second embodiment, amplifiers of a number equaling the number of repeaters are not inserted into the signal lines and, thereby, power consumption can be reduced.

In addition, the design of the bus circuit becomes easy by determining the number of insertion patterns in accordance with the signal line length.

[Third Embodiment]

Though a bus circuit in the case that the direction of travel of data signals is in only one direction is described in the first and second embodiments, it is preferable to make the segment during which data signals on the neighboring signal lines run together in opposite phases half the signal line length in a bus circuit wherein data signals are exchanged in a bi-directional manner.

Figure 6:
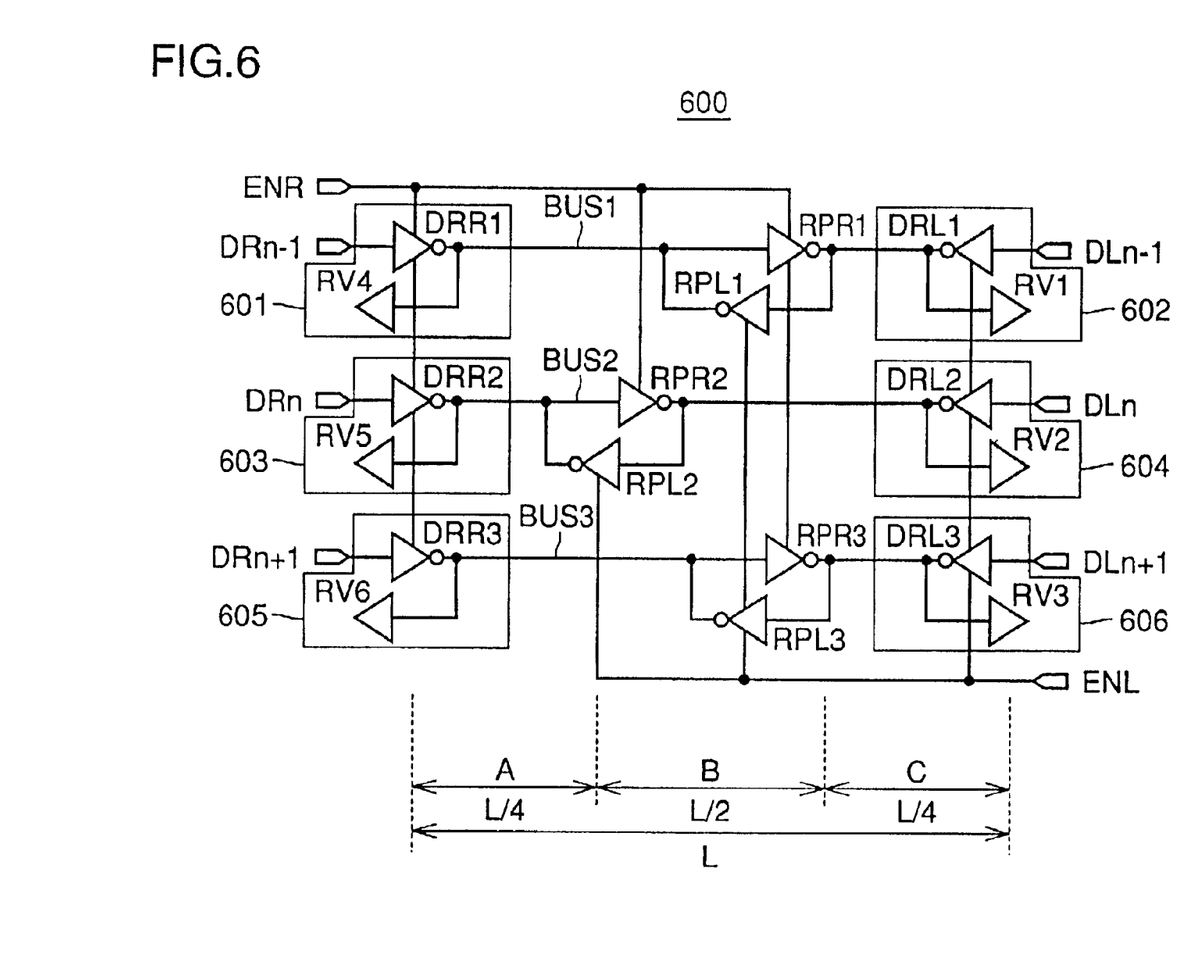
FIG. 6 is a circuit diagram of a bus circuit according to a third embodiment of this invention.

FIG. 6 is a circuit diagram of a bus circuit according to the third embodiment of this invention.

Referring to FIG. 6, a bus circuit 600 includes signal lines BUS1 to BUS3 of which the length is L, input/output circuits 601 to 606, repeaters RPR1 to RPR3 and RPL1 to RPL3.

Input/output circuit 601 includes a driver DRR1 and a receiver RV4. Input/output circuit 602 includes a driver DRL1 and a receiver RV1. Input/output circuit 601 is connected to one end of signal line BUS1 while input/output circuit 602 is connected to the other end of signal line BUS1. Signal lines BUS1 transfers data signals in two directions.

When data signal $DR_{n-1}$ outputted from driver DRR1, data signal $DR_{n-1}$ is inputted into receiver RV1. On the other hand, when data signal $DL_{n-1}$ is outputted from driver DRL1 data signal $DL_{n-1}$ is inputted into receiver RV4.

Input/output circuit 603 includes driver DRR2 and receiver RV5 while input/output circuit 604 includes driver DRL2 and receiver RV2. In addition, input/output circuit 603 is connected to one end of signal lines BUS2 that corresponds to one end of signal line BUS1 to which input/output circuit 601 is connected while input/output circuit 604 is connected to the other end of signal line BUS2. Signal line BUS2 transfers data signals in two directions.

Input/output circuit 605 includes driver DRR3 and receiver RV6 while input/output circuit 606 includes driver DRL3 and receiver RV3. In addition, input/output circuit 605 is connected to one end of signal line BUS3 that corresponds to one end of signal line BUS1 to which input/output circuit 601 is connected while input/output circuit 606 is connected to the other end of signal line BUS3. Signal lines BUS3 transfers data signals in two directions.

Driver activation signal ENR is inputted into drivers DRR1, DRR2 and DRR3. In addition, driver activation signal ENL is inputted into drivers DRL1, DRL2 and DRL3.

Figure 7:
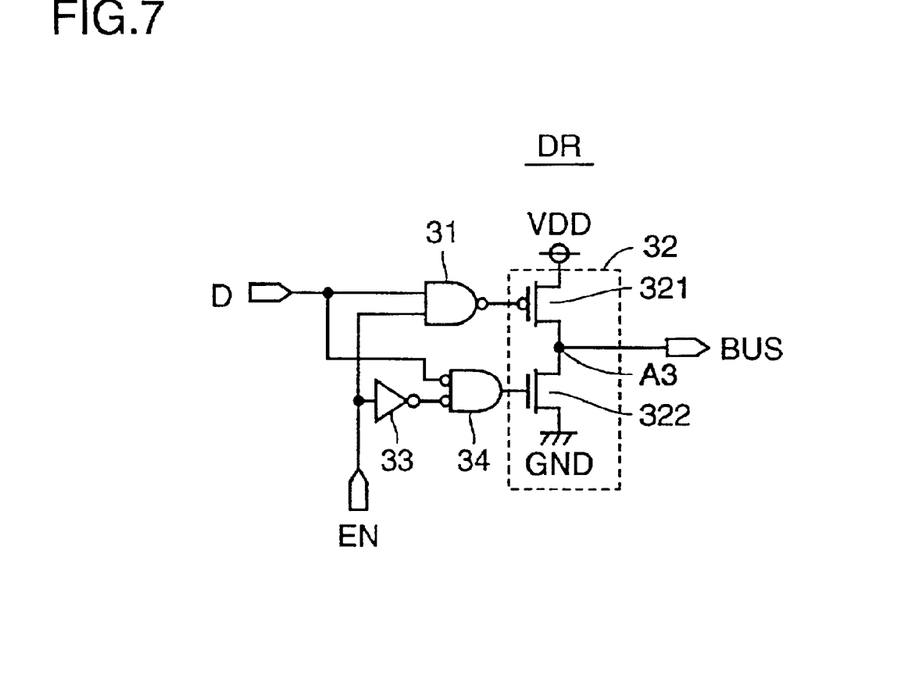
FIG. 7 is a circuit diagram of a driver utilized in a bus circuit.

FIG. 7 is a circuit diagram of drivers DRR1 to DRR3 and DRL1 to DRL3 utilized in bus circuit 600. Since every driver has the same circuit configuration, drivers DRR1 to DRR3 and DRL1 to DRL3 are referred to as driver, of which the circuit configuration is described.

Referring to FIG. 7, a driver includes inverters 32, 33, a NAND gate 31 and a NOR gate 34.

Inverter 32 includes a P channel MOS transistor 321 and an N channel MOS transistor 322 connected in series between power source node VDD and ground node GND. The source of P channel MOS transistor 321 is connected to power source node VDD while the source of N channel MOS transistor 322 is connected to ground node GND. In addition, the drain of P channel MOS transistor 321 and the drain of N channel MOS transistor 322 are connected at node A3.

NAND gate 31 receives ENR or ENL, which is a driver activation signal from a circuit block, and calculates the logical product of the data signal and driver activation signal ENR or ENL. NAND gate 31 outputs a signal gained by inverting the calculation result into the gate of P channel MOS transistor 321.

A signal outputted from inverter 33 and a data signal are inputted into NOR gate 34, which calculates a logical sum of the output signal and the data signal. A signal outputted from NOR gate 34 is inputted into the gate of the N channel MOS transistor 322. Inverter 33 receives driver activation signal ENR or ENL, which is inverted.

Referring, again, to FIG. 6, when driver activation signal ENR is set in the active condition (H level), drivers DRR1 to DRR3 are activated so as to output data signals $DR_{n-1}$, $DR_n$ and $DR_{n+1}$, respectively. At this time, driver activation signal ENL is in an inactive condition. Therefore, drivers DRL1 to DRL3 are in an inactive condition. Data signals $DR_{n-1}$, $DR_n$, $DR_{n+1}$ outputted from drivers DRR1 to DRR3 are respectively inputted into receivers RV1 to RV3.

On the other hand, when driver activation signal ENL is set in the active condition (H level), drivers DRL1 to DRL3 are activated so as to output data signals $DL_{n-1}$, $DL_n$, $DL_{n+1}$, respectively. At this time, drive activation signal ENR is in an inactive condition. Accordingly, drivers DRR1 to DRR3 are in an inactive condition. Accordingly, data signals $DL_{n-1}$, $DL_n$, $DL_{n+1}$ outputted from drivers DRL1 to DRL3 are respectively inputted into receivers RV4 to RV6.

Repeaters RPR1 and RPL1 are connected to signal line BUS1 in the position of 3L/4 from input/output circuit 601. In the same manner, repeaters RPR2 and RPL2 are connected to signal line BUS2 in the position of L/4 from input/output circuit 603. In the same manner, repeaters RPR3 and RPL3 are connected to signal line BUS3 in the position of 3L/4 from input/output circuit 605.

Figure 8:
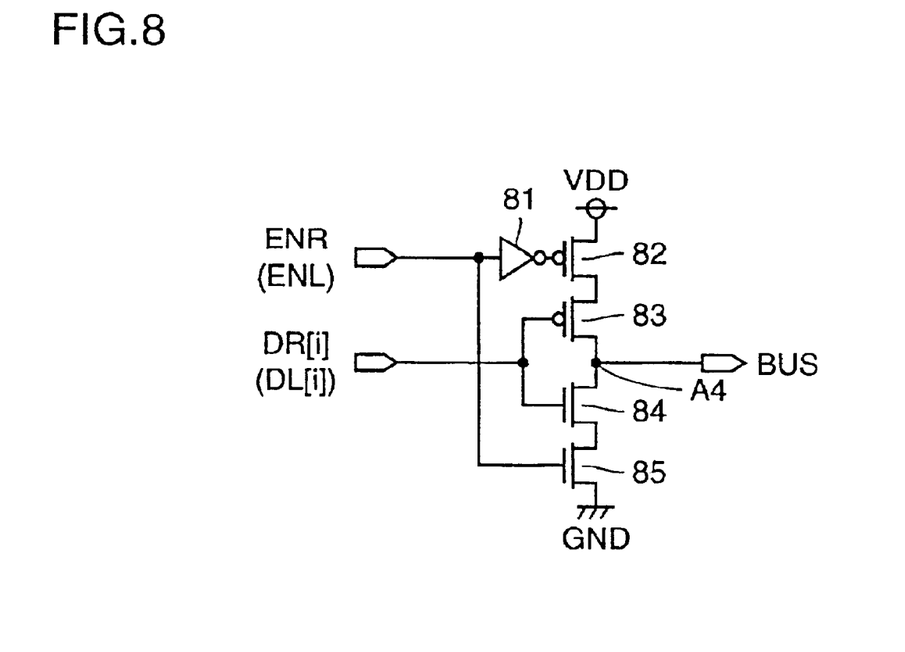
FIG. 8 is a circuit diagram of a repeater utilized in a bus circuit.

FIG. 8 is a circuit diagram of repeaters RPR1 to RPR3 and RPL1 to RPL3. Since every repeater has the same circuit configuration, repeaters RPR1 to RPR3 and RPL1 to RPL3 are referred to as repeater, of which the circuit configuration is described.

A repeater includes an inverter 81, P channel MOS transistors 82, 83 and N channel MOS transistors 84, 85.

P channel MOS transistors 82, 83 and N channel MOS transistors 84, 85 are connected in series between power source node VDD and ground node GND. The source of P channel MOS transistor 82 is connected to power source node VDD while the drain thereof is connected to the source of P channel MOS transistor 83. The drain of P channel MOS transistor 83 is connected to the drain of N channel MOS transistor 84. The source of N channel MOS transistor 84 is connected to the drain of N channel MOS transistor 85. The source of N channel MOS transistor 85 is connected to ground node GND.

Driver activation signal ENR is inputted into the gate of P channel MOS transistor 82 and into the gate of N channel MOS transistor 85 in repeaters RPR1 to RPR3. In addition, a data signal is inputted into the gate of P channel MOS transistor 83 and into the gate of N channel MOS transistor 84.

Driver activation signal ENL is inputted into the gate of P channel MOS transistor 82 and into the gate of N channel MOS transistor 85 in repeaters RPL1 to RPL3. In addition, a data signal is inputted into the gate of P channel MOS transistor 83 and into the gate of N channel MOS transistor 84.

Here, the operation of bus circuit 600 is described while taking into account signal line BUS2.

In the case that data signal $DR_n$ is transferred on signal line BUS2, the driver activation signal ENR is in an active condition. Thereby, driver DRR2 and repeater RPR2 are activated. In addition, driver activation signal ENL is maintained in the inactive condition and, therefore, driver DRL2 and repeater RPL2 become inactivated.

Thereby, data signal $DR_n$ is outputted from driver DRR2, is transferred on signal line BUS2 and is inputted into receiver RV2.

On the other hand, in the case that data signal $DL_n$ is transferred on signal line BUS2, driver activation signal ENL is in an active condition. Thereby, driver DRL2 and repeater RPL2 are activated. In addition, driver activation signal ENR maintains the inactive condition and, therefore, driver DRR2 and repeater RPR2 become inactivated.

Thereby, data signal $DL_n$ is outputted from driver DRL2, is transferred on signal line BUS2 and is inputted into receiver RV5.

Here, the operation of transmitting data signals $DR_{n-1}$, $D_{n-1}$ on signal line BUS1 and the operation of transmitting data signals $DR_{n+1}$, $DL_{n+1}$ on signal line BUS3 are the same as the operation on signal line BUS2, of which descriptions are not repeated.

In accordance with the above described operation, bus circuit 600 can transfer data signals in two directions.

Furthermore, each repeater is provided on neighboring signal lines so that the segment during which data signals run together in opposite phases becomes half the signal line length L. Accordingly, the slowing of the operation speed of bus circuit 600 is prevented.

[Fourth Embodiment]

Figure 9:
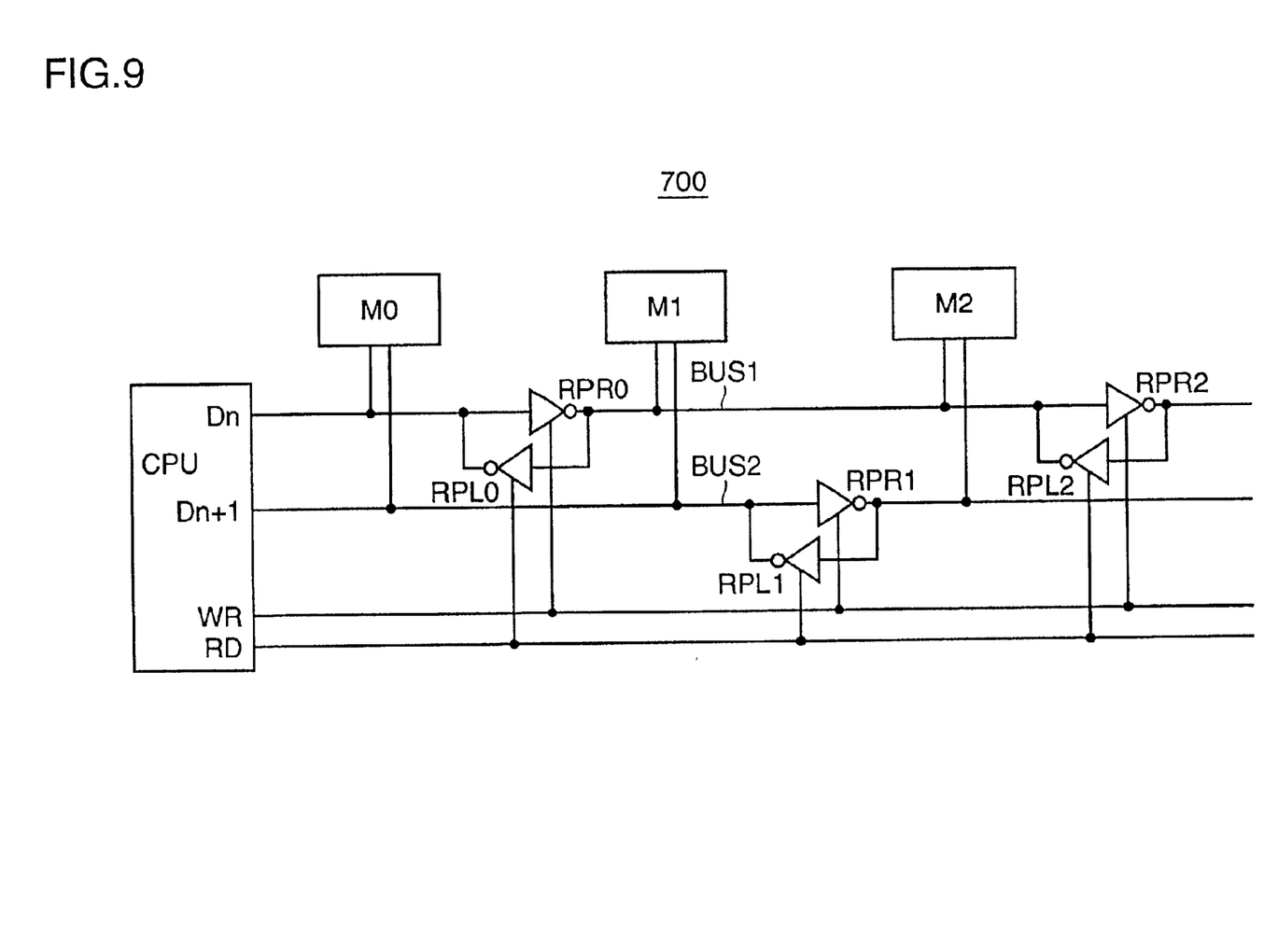
FIG. 9 is a circuit diagram of a bus circuit according to a fourth embodiment of this invention.

FIG. 9 is a circuit diagram of bus circuit 700 according to the fourth embodiment of this invention.

Referring to FIG. 9, bus circuit 700 includes signal line BUS 1, BUS2, memories M0 to M2, an operation unit CPU, repeaters RPR0 to RPR2 and RPL0 to RPL2.

Memory M0 is connected to signal lines BUS1 and BUS2. In the same manner, memory M1 and M2 are also connected to signal lines BUS1 and BUS2.

In addition, the operation unit CPU controls the read-operation from each memory and the write-operation to each memory. The operation unit CPU is connected to signal lines BUS1 and BUS2.

Repeaters RPR0 to RPR2 and RPL0 to RPL2 are provided on the signal lines BUS. Repeaters RPR0 to RPR2 receive write control signal WR and are activated. In addition, repeaters RPL0 to RPL2 receive read control signal RD and are activated. Repeaters RPR0 to RPR2 are provided so that the segment during which data signals on the neighboring signal lines BUS1 and BUS2 run together in opposite phases at the time of write in operation becomes half the signal line length. In addition, repeaters RPL0 to RPL2 are provided so that the segment during which data signals on the neighboring signal lines BUS1 and BUS2 run together in opposite phases at the time of read operation becomes half the signal line length.

The operation of bus circuit 700 which has the above described circuit configuration is described.

At the time of the read-operation, read control signal RD outputted from the operation unit CPU is activated. At this time, repeaters RPL0 to RPL2 receive read control signal RD and are activated. Therefore, a data signal is transferred from each module to the CPU. In addition, repeaters RPL0 to RPL2 are provided so that the segment during which data signals on the neighboring signal lines run together in opposite phases becomes half the signal line length and, therefore, the operation speed of bus circuit 700 is not slowed.

In the same manner, at the time of the write-operation, write control signal WR outputted from the operation unit CPU is activated. At this time, repeaters RPR0 to RPR2 receive write control signal WR and are activated. As a result, a data signal is transferred from the operation unit CPU to each module.

As described above, repeaters used at the time of the write-operation and repeaters used at the time of the read-operation are, respectively, provided and by activating one of the repeaters by means of a read control signal or a write control signal, the segment during which data signals on the neighboring signal lines run together in opposite phases can be made to be half the signal line length. Therefore, the operation speed of bus circuit 700 can be prevented from becoming slowed.

[Fifth Embodiment]

In the case that a plurality of circuit blocks are connected to the signal line, the operation speed can be prevented from becoming slowed by providing repeaters.

Figure 10:
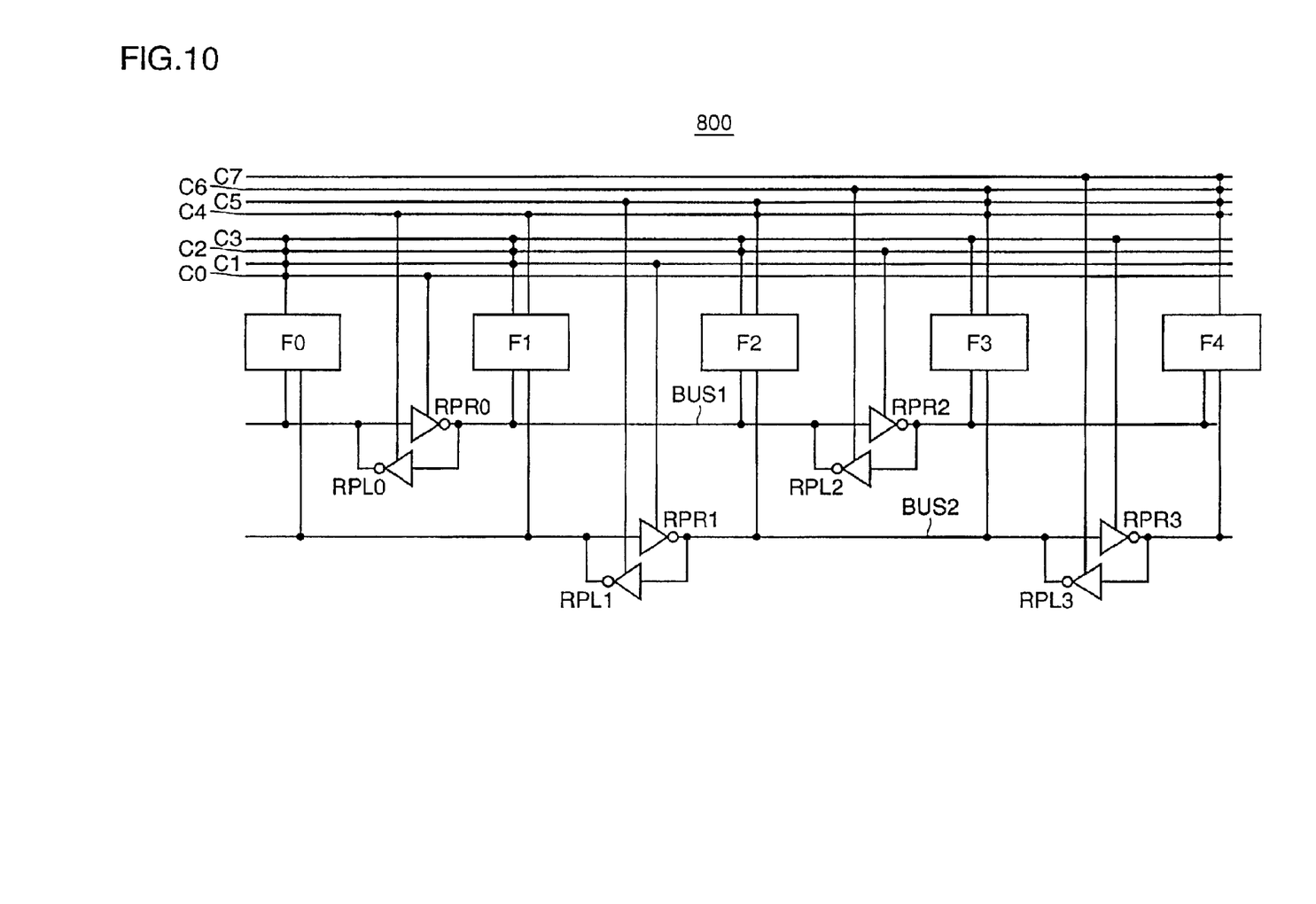
FIG. 10 is a circuit diagram of a bus circuit according to a fifth embodiment of this invention.

FIG. 10 is a circuit diagram of a bus circuit 800 according to the fifth embodiment of this invention.

Bus circuit 800 includes signal lines BUS1, BUS2, circuit blocks F0 to F4, repeaters RPR0 to RPR3 and RPL0 to RPL3.

Signal lines BUS1 and BUS2 transfer data signals in two directions. Circuit blocks F0 to F4 are, for example, operation units or memories. Circuit blocks F0 to F4 are, respectively, connected to signal lines BUS1 and BUS2. Repeaters RPR0 to RPR3 and RPL0 to RPL3 are provided so that the segment during which data signals on signal lines BUS1 and BUS2 run together in opposite phases becomes half the signal line length. In FIG. 10 repeater RPR0 and repeater RPL0 are connected to signal line BUS 1 between circuit block F0 and circuit block F1.

In the same manner, repeater RPR1 and repeater RPL1 are connected to signal line BUS2 between circuit block F1 and circuit block F2. Repeater RPR2 and repeater RPL2 are connected to signal line BUS1 between circuit block F2 and circuit block F3. Repeater RPR3 and repeater RPL3 are connected to signal line BUS2 between circuit block F3 and circuit block F4.

Bus circuit 800 further includes control signal lines C0 to C7 for transmitting control signals for controlling each circuit block and each repeater. Control signal line C0 is connected to circuit block F0 and repeater RPR0. Control signal line C1 is connected to circuit block F0, circuit block F1 and repeater RPR1. Control signal line C2 is connected to circuit block F0, circuit block F1, circuit block F2 and repeater RPR2. Control signal line C3 is connected to circuit blocks F0 to F3 and repeater RPR3.

In the same manner, control signal line C7 is connected to circuit block F4 and repeater RPL3. Control signal line C6 is connected to circuit blocks F3, F4 and repeater RPL2. Control signal line C5 is connected to circuit blocks F2 to F4 and repeater RPL1. Control signal line C4 is connected to circuit blocks F1 to F4 and repeater RPL0.

The operation of bus circuit 800 having the above described circuit configuration is described.

By taking into account circuit block F2 in FIG. 10, the case where a data signal is transmitted from circuit block F2 is described.

In the case that a data signal is outputted from circuit block F2, control signals of control signal lines C2 to C5 are activated. Therefore, repeater RPR2 connected to control signal line C2 is activated. In the same manner, repeater RPR3 connected to control signal line C3, repeater RPL0 connected to control signal line C4 and repeater RPL1 connected to control signal line C5 are activated. Accordingly, data signals outputted from circuit block F2 can be transmitted to respective circuit blocks F0, F1, F3 and F4. In the case that data signals are outputted from other circuit blocks, repeaters required for transmitting data signals are activated.

As described above, in a versatile bus, the segment during which data signals on the neighboring signal lines run together in opposite phases can be made half the signal line length.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A bus circuit comprising:
  a plurality of substantially parallel signal lines for transmitting data thereon, each signal line including one or more bi-directional inverting repeaters, each bi-directional inverting repeater connected between first and second connection nodes on one of the signal lines,
  wherein each bi-directional inverting repeater receives a first signal from the first connection node and outputs a logically inverted signal of the first signal to the second connection node in a first direction data transmission, and receives a second signal from the second connection node and outputs a logically inverted signal of the second signal to the first connection node in a second direction data transmission, the bi-directional inverting repeaters are positioned on each signal line such that data transmitted on each signal line and data transmitted on the signal line adjacent to said each signal line are in opposite phase on approximately one-half of the signal line, and the signal lines are divided into alternating even-numbered signal lines and odd-numbered signal lines, and the bi-directional inverting repeaters of the even-numbered signal lines are substantially offset with respect to the bi-directional inverting repeaters of the odd-numbered signal lines along a length of the signal lines.

2. The bus circuit according to claim 1, wherein the bi-directional inverting repeaters of the even-numbered signal lines are offset along the length of the signal lines to about one-half the distance between two bi-directional inverting repeaters of an odd-numbered signal line.

3. The bus circuit according to claim 1, wherein the signal lines are each divided into alternating first and second segments along the length of the signal lines, the first and second segments being of substantially equal length, wherein the bi-directional inverting repeaters of the even-numbered signal lines are all positioned in the first segments and the bi-directional inverting repeaters of the odd-numbered signal lines are all positioned in the second segments.

4. The bus circuit according to claim 3, wherein the bi-directional inverting repeaters of the even-numbered signal lines are substantially centered in the first segments and the bi-directional inverting repeaters of the odd-numbered signal lines are substantially centered in the second segments.

5. The bus circuit according to claim 4, wherein said signal lines are connected to a plurality of circuit blocks.

6. The bus circuit according to claim 5, wherein said plurality of circuit blocks include operation units.

7. The bus circuit according to claim 5, wherein said plurality of circuit blocks include memories.

8. The bus circuit according to claim 5, wherein at least one circuit block is connected to the signal lines at a position substantially away from an end of the signal lines.

9. The bus circuit according to claim 8, wherein at least one circuit block receives half of the data of the signal lines in an inverted state and the other half of the data in a non-inverted state.

10. A bus circuit comprising:

a plurality of substantially parallel signal lines transmitting data thereon, each signal line including one or more bi-directional inverting repeaters, each bi-directional inverting repeater connected between first and second connection nodes on one of the signal lines, wherein each bi-directional inverting repeater receives a first signal from the first connection node and outputs a logically inverted signal of the first signal to the second connection node in a first direction data transmission, and receives a second signal from the second connection node and outputs a logically inverted signal of the second signal to the first connection node in a second direction data transmission, one or more bi-directional inverting repeaters of each signal line are positioned on each signal lines with an offset to one or more bi-directional inverting repeaters of adjacent one of the signal lines with respect to positions along a length direction of the signal lines, and the signal lines are divided into alternating even-numbered signal lines and odd-numbered signal lines, and the bi-directional inverting repeaters of the even-numbered signal lines are substantially offset with respect to the bi-directional inverting repeaters of the odd-numbered signal lines along a length of the signal lines.

11. A method of designing a bus circuit that includes a plurality of substantially parallel signal lines for transmitting data thereon, each signal line including one or more bi-directional inverting repeaters, the signal lines being divided into alternating even-numbered signal lines and odd-numbered signal lines, each inverting repeater connected between first and second connection nodes on one of the signal lines, wherein each inverting repeater receives a first signal from the first connection node and outputs a logically inverted signal of the first signal to the second connection node in a first direction data transmission, and receiving a second signal from the second connection node and outputs a logically inverted signal of the second signal to the first connection node in a second direction data transmission, the method comprising:

preparing a first pattern having a first length that includes a segment of an odd-numbered signal line and a segment of an even-numbered signal line, with a bi-directional inverting repeater placed in the odd-numbered signal line segment and no bi-directional inverting repeater placed in the even-numbered signal line segment;

preparing a second pattern having length substantially equal to that of the first pattern length, said second pattern having a segment of an odd-numbered signal line and a segment of an even-numbered signal line, with a bi-directional inverting repeater placed in the even-numbered signal line segment and no bi-directional inverting repeater placed in the odd-numbered signal line segment;

determining the numbers of first and second patterns to be arranged in accordance with a length of said signal lines; and arranging alternatively the determined number of first and second patterns.

* * * * *